United States Patent [19]

Nakamura

[11] Patent Number: 4,603,365
[45] Date of Patent: Jul. 29, 1986

[54] MAGNETIC DETECTION APPARATUS

[75] Inventor: Shigekazu Nakamura, Ageo, Japan

[73] Assignee: Copal Company Limited, Tokyo, Japan

[21] Appl. No.: 473,331

[22] Filed: Mar. 8, 1983

[30] Foreign Application Priority Data

Mar. 10, 1982 [JP] Japan ............................. 57-36644

[51] Int. Cl.$^4$ .......................... G11B 5/127; G11B 5/33
[52] U.S. Cl. ...................................... 360/113; 324/225; 324/252; 338/32 R
[58] Field of Search ................. 360/113; 324/252, 225, 324/244; 338/32 R

[56] References Cited

U.S. PATENT DOCUMENTS

| 3,757,154 | 9/1973 | Okita | 324/252 X |
| 3,969,769 | 7/1976 | Gorter | 360/113 |
| 3,979,775 | 9/1976 | Schwarz | 360/113 |
| 4,184,631 | 1/1980 | Lazzari | 360/113 X |
| 4,212,041 | 7/1980 | Lazzari | 360/113 |
| 4,380,735 | 4/1983 | Bell | 324/225 X |

FOREIGN PATENT DOCUMENTS 115257 9/1979 Japan .
162556 12/1979 Japan .
35011 4/1981 Japan .

Primary Examiner—A. J. Heinz
Attorney, Agent, or Firm—Stevens, Davis, Miller & Mosher

[57] ABSTRACT

A magnetic detection apparatus for use in an encoder includes a first magnetic sensor for detecting an external magnetic field and a second magnetic sensor for detecting a signal magnetic field. The first magnetic sensor is constructed by two magnetoresistive elements and a conductive layer arranged therebetween for applying a magnetic bias thereto. The second magnetic sensor is constructed by two magnetoresistive elements, first conductive layer arranged therebetween for applying a magnetic bias thereto and second conductive layer arranged on one side of two magnetoresistive elements for canceling an effect of the external magnetic field by feeding back a differential output derived from the first magnetic sensor thereto. In such a construction, it is possible to derive from the second magnetic sensor only a signal representing the signal magnetic field without being affected by the external magnetic field.

16 Claims, 11 Drawing Figures

MAGNETIC DETECTION APPARATUS

BACKGROUND OF THE INVENTION

The present invention relates to a magnetic detection apparatus for use in a rotary encoder, a linear encoder, etc.

There has been well known a rotary encoder for detecting a rotation angle of a rotation axis, in which the rotation angle is detected by reading magnetic signals previously recorded in the form of a magnetization pattern having a constant bit length on a magnetic record medium applied on a circular plate or a cylinder coupled with the rotation axis by means of a magnetic sensor including a magnetoresistive (MR) element. However, when the rotation angle of a motor is detected by the conventional rotary encoder, there occurs drawbacks that the S/N ratio of a detection signal supplied from the magnetic sensor is decreased and an erroneous operation is effected due to an external magnetic field, because a large amount of the external magnetic field leaks from a permanent magnet or an armature of the motor.

In order to eliminate the drawbacks mentioned above, there has been proposed, in Japanese Patent Laid-Open Publication No. 162,556/79, an angle detector comprising a magnetic shielding member made of high permeable magnetic material for surrounding a circular plate including a magnetic record medium and coupled with an output axis of the motor, a magnetic sensor arranged opposite to the circular plate and driving circuit and signal processing circuit connected to the sensor. However, it is not possible to shield the angle detector completely from the external magnetic field. Moreover, in order to remove the influence of the external magnetic field, it may be further considered that only the external magnetic field is detected by a separate magnetic sensor and the thus detected signal and the output signal derived from the magnetic recording medium are electrically calculated. However, in this case, since a magnetic-resistance characteristic of the MR element consisting of the magnetic sensor is not linear, the output signal of the separate magnetic sensor due to the external magnetic field does not correspond to a part of the output signal of the other sensor due to the external magnetic field, and thus it is not possible to perform a highly accurate compensation. Moreover, the dynamic range of the MR element could not be used effectively for detecting the magnetic pattern, particularly under the large external magnetic field.

In the rotary encoder mentioned above, it is possible to detect the magnetic signals by a single MR element so as to obtain the displacement amount. However, since the output voltage is small and drifts due to the temperature variation, it is general to derive the output voltage from a circuit wherein more than two MR elements are differentially connected. For example, in Japanese Patent Laid-Open Publication No. 115,257/79, is disclosed an angle detector wherein two MR elements are arranged by a distance which is an integral number of a pitch of the magnetization pattern on the magnetic recording medium and an output difference therebetween is derived from a differential amplifier. Moreover, an angle detector of this type shown in FIG. 1 is described in a Japanese magazine, "Nikkei Electronics", page 88 published on June 22, 1981. As shown in FIG. 1, two groups of magnetic sensors each having four MR elements $A_1$ to $A_4$ and $B_1$ to $B_4$ are arranged. Then, MR elements in one group are arranged apart by a half of a pitch P of a magnetization pattern recorded on a magnetic recording medium M, and MR elements in the other group are arranged apart by P/4 with respect to the MR elements in the other group. Further, as shown in FIG. 2, the four MR elements of each groups are connected as a bridge circuit, and a difference between output voltages generated at diagonal points of each bridge circuit are derived from respective differential amplifiers $DA_1$ and $DA_2$. In this magnetic detector, it is possible to detect not only a displacement amount, but also a displacement direction. Moreover, it is possible to make an output amplitude large and to remove the effect of the drift. However, in the conventional angle detector, it is necessary to arrange more than two MR elements apart from each other in a displacement direction D, i.e. in an arranging direction of the magnetization pattern by an interval which is equal to an integer multiple of the pitch P of the magnetization pattern or to a reciprocal thereof. Therefore, when use is made of various magnetization patterns having different pitches, it is necessary to prepare various magnetic sensors having MR elements which are arranged apart by predetermined intervals corresponding to the various pitches of the magnetization patterns. Therefore, there occurs a drawback that the freedom of design is limited to a great extent. Moreover, in case of arranging the magnetic recording medium on the cylinder side surface, if a plurality of MR elements are arranged on a plane substrate, the distances between each MR element and the magnetic recording medium are not equal. Therefore, the output signal of each MR element is fluctuated due to the distance variation, and thus the differential output includes an error.

In order to eliminate the drawbacks mentioned above, there has been proposed in Japanese Patent Laid-Open Publication No. 35,011/81 an angle detector wherein a width of each MR element is varied, but it is a very cumbersome task to manufacture the MR elements each having a different width. Moreover, if the distance between the MR element and the magnetic recording medium is varied as mentioned above, it is necessary to arrange the MR elements each having a different width corresponding to such distance. In addition, if more than two MR elements are arranged in the direction of the magnetization pattern recorded on the magnetic recording medium, a dimension of the magnetic sensor is made large and thus the detection apparatus is liable to be large in size correspondingly.

SUMMARY OF THE INVENTION

The present invention has for its object to eliminate the drawbacks mentioned above and to provide a magnetic detection apparatus which can detect a magnetization pattern accurately without being affected by an external magnetic field by separating a signal magnetic field from the external magnetic field.

It is another object of the invention to provide a magnetic detection apparatus wherein in case of separating the signal magnetic field derived from a magnetic recording medium from the external magnetic field it is not necessary to arrange MR elements apart from each other in a direction of a magnetization pattern recorded on the magnetic recording medium.

Another object of the invention is to provide a magnetic detection apparatus which can easily derive a differential output.

According to the invention, a magnetic detection apparatus comprises a first magnetic sensor including a magnetoresistive element exposed to a first magnetic field;

a second magnetic sensor including a magnetoresistive element exposed to both first and second magnetic fields; and means for feeding back negatively an output signal detected by said first magnetic sensor to the second magnetic sensor so as to cancel the first magnetic field applied to the second magnetic sensor, whereby the second magnetic field is detected separately from the first magnetic field.

DESCRIPTION OF THE PREFERRED EMBODIMENTS

Figure 1:
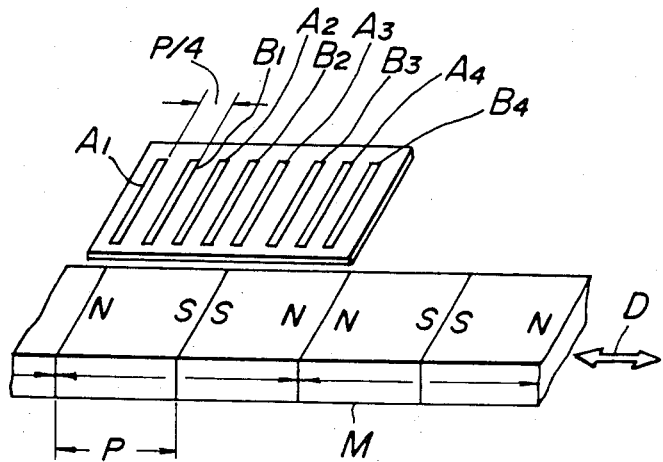
FIG. 1 is a perspective view showing one embodiment of a conventional magnetic detection apparatus.
Figure 2:
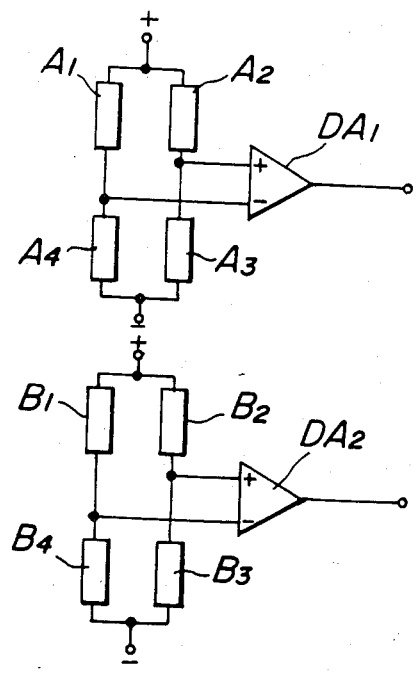
FIG. 2 is a circuit diagram illustrating a bridge circuit construction of the conventional apparatus shown in FIG. 1.
Figure 3:
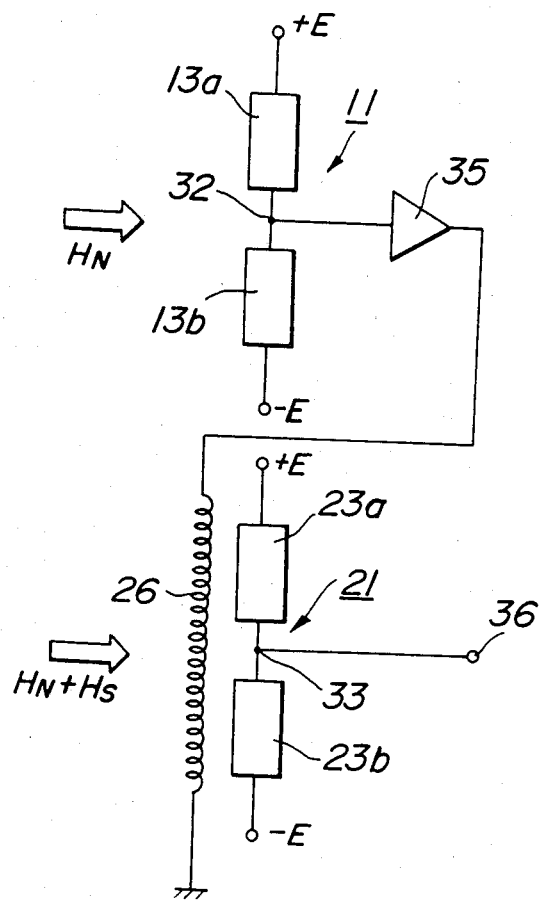
FIG. 3 is a schematic view depicting one embodiment of the magnetic detection apparatus according to the invention.
Figure 4A:
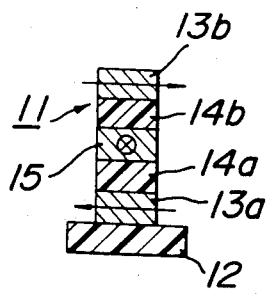
FIGS. 4A and 4B are cross sectional views showing one embodiment of a magnetic sensor according to the invention.
Figure 4B:
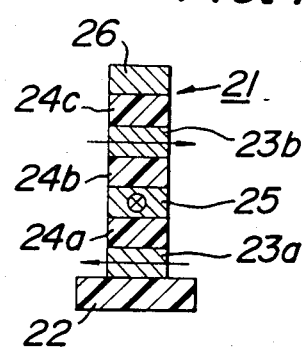
Figure 5:
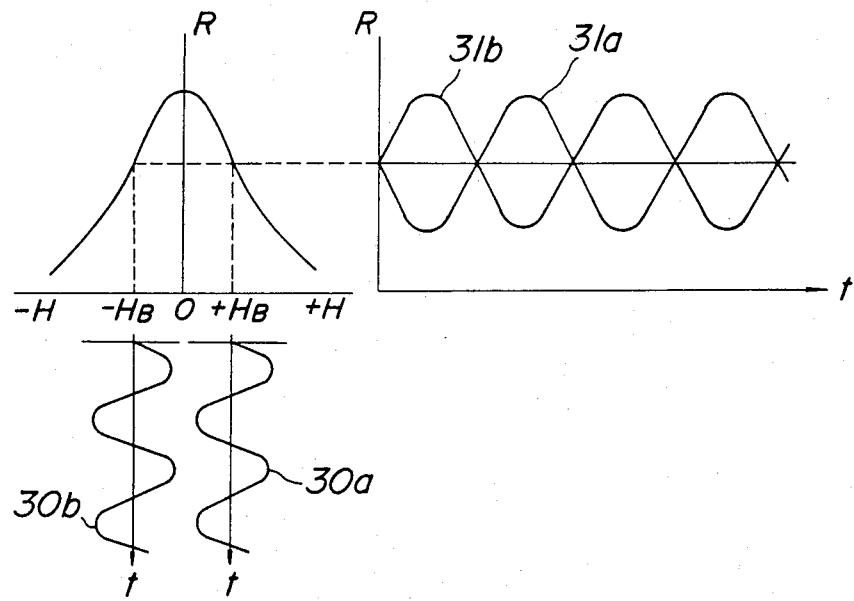
FIG. 5 is a waveform explaining an operation of the magnetic sensors shown in FIGS. 4A and 4B.
Figure 6:
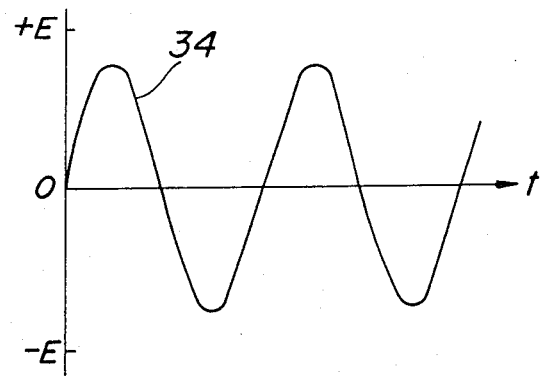
FIG. 6 is a waveform illustrating a differential output of the magnetic sensors shown in FIGS. 4A and 4B.

FIG. 3 is a schematic view showing one embodiment of the magnetic detection apparatus according to the invention. In this embodiment, in order to detect a signal magnetic field $H_S$ under the condition that an external magnetic field $H_N$ is uniformly applied, a first magnetic sensor 11 is arranged at a position where only the external magnetic field $H_N$ is applied and a second magnetic sensor 21 is arranged at a position where both the signal magnetic field $H_S$ and the external magnetic field $H_N$ are applied. As shown in FIG. 4A, the first magnetic sensor is constructed by arranging on a substrate 12, MR element 13a, insulating film 14a, conductive film 15, insulating film 14b and MR element 13b successively. In this construction, the MR elements 13a and 13b are magnetically biased in opposite directions to each other as shown by arrows by supplying an electric current to the conductive film 15 in a predetermined direction. Moreover, as shown in FIG. 4B, the second magnetic sensor 21 is constructed by arranging successively MR element 23a, insulating film 24a, conductive film 25, insulating film 24b, MR element 23b, insulating film 24c and conductive film 26 on a substrate 22. The same as with the first magnetic sensor 11, the MR elements 23a and 23b are magnetically biased in opposite directions to each other as shown by arrows by applying an electric current to the conductive film 25 in a predetermined direction. In this manner, if two MR elements 13a, 13b; 23a, 23b in the magnetic sensors 11, 21 are magnetically biased in the opposite directions to each other, when the magnetic field is varied as shown by curves 30a and 30b in FIG. 5, respectively, the resistance value R of the MR elements is varied as shown by curves 31a and 31b, respectively. In this case, it is preferable that the bias magnetic fields $\pm H_B$ are determined in such a manner that two operating points of the MR elements 13a, 13b; 23a, 23b are situated at center positions on a substantially linear portion of a magnetic-resistance characteristic curve. In this manner, if the MR elements 13a, 13b; 23a, 23b in the magnetic sensors 11, 12 are magnetically biased in the opposite directions, these MR elements have a relationship between their magnetic fields and resistance values R which are in opposite phase to each other as shown by curves 31a and 31b in FIG. 5. In this embodiment, these MR elements 13a, 13b; 23a, 23b are connected in series as shown in FIG. 3, both ends of which are connected to positive and negative terminals $+E$ and $-E$ of a power supply, respectively and thus a differential output shown by curve 34 in FIG. 6 is derived from connecting points 32 and 33 of these MR elements.

In the embodiment mentioned above, a differential output derived from the first magnetic sensor 11 is negatively fed back to the conductive film 26 of the second magnetic sensor 21 through an amplifier 35 as shown in FIG. 3, and an inverting magnetic field $-H_N$ which cancels the external magnetic field $H_N$ is applied to the MR elements 23a, 23b by an electric current passing through the conductive film 26. In such a construction, since the external magnetic field $H_N$ which affects the MR elements 23a, 23b is canceled by the inverting magnetic field $-H_N$ caused by the electric current passing through the conductive film 26, it is possible to derive the differential output with a good S/N ratio which depends only upon the signal magnetic field $H_S$ from an output terminal 36 of the second magnetic sensor 21. In case of generating the bias magnetic field by passing the electric current through the conductive films 15, 25 which are arranged between MR elements 13a, 13b; 23a, 23b, a variation of the direct current source affects both MR elements equally and thus this variation is not introduced in the differential output.

Figure 7:
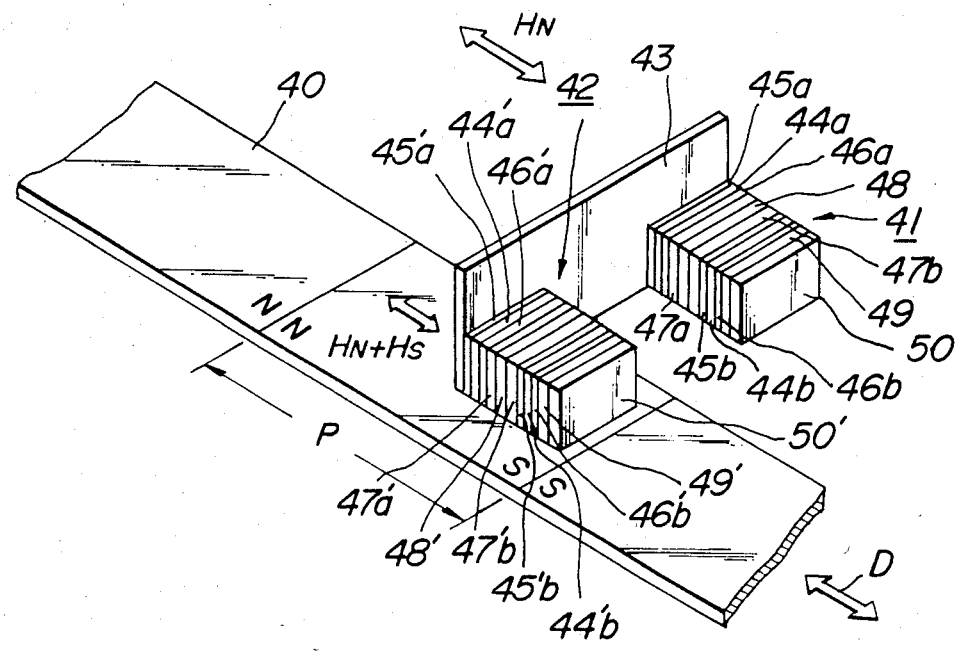
FIG. 7 is a perspective view depicting another embodiment of the magnetic detection apparatus according to the invention.

FIG. 7 is a perspective view showing another embodiment of the magnetic detection apparatus according to the invention. In this embodiment, a magnetic recording medium 40 is secured to an object which is moved under the existance of the external magnetic field $H_N$, and a displacement amount of the object is obtained by detecting a magnetic pattern recorded on the magnetic recording medium 40 in an arrow direction D by a predetermined pitch P. First and second magnetic sensors 41 and 42 are arranged apart from each other on the same substrate 43 in such a manner that the first magnetic sensor 41 is apart from the magnetic recording medium 40 and the second magnetic sensor 42 is opposed to the magnetic recording medium 40, so that the first magnetic sensor 41 is exposed only to the external magnetic field $H_N$ and the second magnetic sensor 42 is exposed to both the external magnetic field $H_N$ and the signal magnetic field $H_S$ derived from the magnetic recording medium 40. In this embodiment, these first and second magnetic sensors 41 and 42 have the same construction. That is to say, MR elements 45a, 46a, 45b, 46b; 45'a, 46'a, 45'b, 46'b are arranged respectively on the same substrate 43 through thin insulating films 44a, 44b; 44'a, 44'b. Moreover, in order to apply the bias magnetic field, conductive films 48; 48' are arranged respectively between MR elements 46a; 46'a and 45b; 45'b through thick insulating films 47a; 47'a and 47b; 47'b. As in the embodiment mentioned above, the direct current is passed through the conductive film 48; 48' and thus MR elements 45a, 46a and 45b, 46b; 45'a, 46'a and 45'b, 46'b can be magnetically biased in the opposite directions to each other. Further, in this embodiment, conductive films 50; 50' are arranged respectively on the MR elements 46b; 46'b through thick insulating films 49; 49'.

Figure 8:
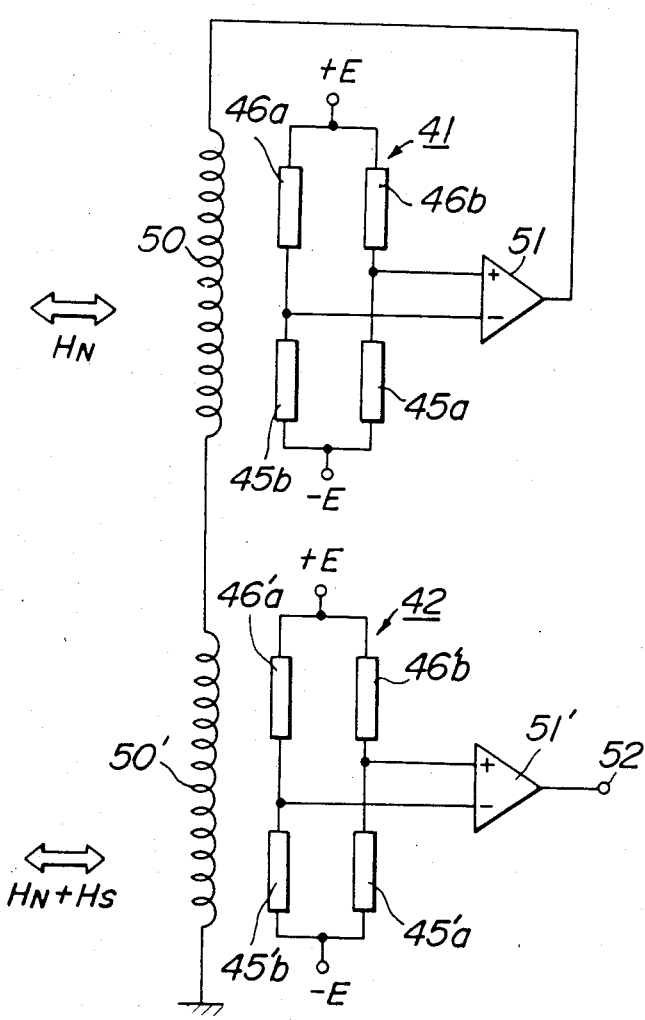
FIG. 8 is a circuit diagram showing the apparatus shown in FIG. 7.

In such a construction, respective four MR elements 45a, 45b, 46a, 46b; 45'a, 45'b, 46'a, 46'b are connected as a bridge circuit shown in FIG. 8. In the first magnetic sensor 41, a junction point between the MR elements 46a and 46b is connected to a positive power source +E and a junction point between the MR elements 45a and 45b is connected to a negative power source −E. Further, a junction point between the MR elements 45a and 46b is connected to a positive input terminal of a differential amplifier 51 and also a junction point between the MR elements 45b and 46a is connected to a negative input terminal of the differential amplifier 51. In the same manner, in the second magnetic sensor 42, a junction point between the MR elements 46'a and 46'b is connected to a positive power source +E and a junction point between the MR elements 45'a and 45'b is connected to a negative power source −E. Further, a junction point between the MR elements 45'a and 46'b is connected to a positive input terminal of a differential amplifier 51', and a junction point between the MR elements 45'b and 46'a is connected to a negative input terminal of the differential amplifier 51'.

In the embodiment mentioned above, the conductive films 50 and 50' consisting of the uppermost layers of the first and second magnetic sensors 41 and 42 are connected in series so as to feed back negatively an output of the differential amplifier 51 to these conductive films 50 and 50'. Therefore, the inverting magnetic field $-H_N$ is applied to respective four MR elements 45a, 45b, 46a, 46b; 45'a, 45'b, 46'a, 46'b so as to cancel the external magnetic field $H_N$ by supplying the electric current through the conductive films 50 and 50'. In this manner, it is possible to derive a differential output with a good S/N ratio which depends only upon the signal magnetic field $H_S$ from an output terminal 52 of the differential amplifier 51'.

As mentioned above, since the external magnetic field $H_N$ is removed even from the first magnetic sensor 41 by feeding back negatively an output of the differential amplifier 51 to the conductive film 50, it is possible to widen a dynamic range of each magnetic sensor, and to detect accurately the weak signal magnetic field under the condition that a strong external magnetic field which is sufficient to saturate the MR element is applied. Moreover, since the first and second magnetic sensors 41 and 42 are formed on the same substrate and have the same construction, they can be easily manufactured.

In the first and second magnetic sensors 41 and 42, the MR elements 45a, 45b, 46a, 46b; 45'a, 45'b, 46'a, 46'b are formed in such a manner that, for example, Fe-Ni alloy (permalloy) is evapoarated onto a glass substrate 43 in about 500 Å thick, and the thin insulating films 44a, 44b; 44'a, 44'b arranged therebetween are formed by evaporating SiO₂ in 1000 to 2000 Å thick. Moroever, the thick insulating films 47a, 47b, 49; 47'a, 47'b, 49' are formed also by evaporating the SiO₂ in a few micro meters thick, and the conductive films 48, 50; 48', 50' are formed by evaporating a nonmagnetic metal such as Al, Au, Cu in more than 1000 Å thick. As mentioned above, since each film is extremely thin, it is possible to assume that all the MR elements are arranged on the same position in a deviation direction of the magnetic field recording medium 40.

Figure 9:
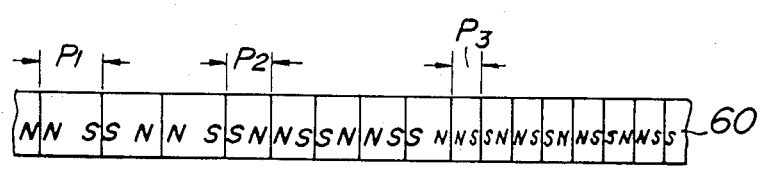
FIGS. 9 and 10 are plan views illustrating another embodiments of a magnetic recording medium for use in a displacement amount detection apparatus according to the invention.
Figure 10:
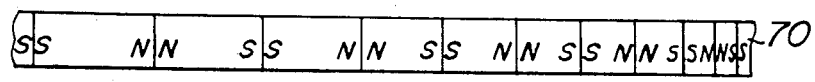

In the displacement detection apparatus shown in FIG. 7, since all the MR elements in the second magnetic sensor 42 arranged opposite to the magnetic recording medium 40 are arranged in a direction perpendicular to the displacement direction of the magnetic recording medum 40, it is not necessary to take into account the pitch P of the magnetization pattern. Therefore, it is not necessary to use only magnetization patterns having the same pitch, and thus as shown in FIGS. 9 and 10 use may be made of magnetization pattern having different pitches $P_1$, $P_2$, $P_3$ recorded on a magnetic recording medium 60 or the magnetization pattern recorded on a magnetic recording medium 70 whose pitch is successively varied as shown in FIG. 10. Magnetization patterns having different pitches are advantageously used when the detection accuracy is varied during the displacement.

The present invention is not limited to the embodiments mentioned above, but various modifications and alternations are possible. For example, in the embodiment shown in FIG. 7 explanation is made for linear magnetic recording medium, but it is possible to use circular or cylindrical magnetic recording medium. Moreover, in the embodiment mentioned above, only the signal magnetic field $H_S$ is separately detected, but not only the signal magnetic field $H_S$, but also the external magnetic field $H_N$ can be separately detected. Further, in the embodiment shown in FIG. 3, only the second magnetic sensor 21 comprises the conductive film 26 for generating the inverting magnetic field, but such a conductive film may be provided also in the first magnetic sensor 11 and the negative feed back operation for the first magnetic sensor 11 may be performed in the same manner shown in FIG. 7. Furthermore, in the embodiment shown in FIG. 3, two MR elements are magnetically biased in the opposite directions to each other by passing the electric current through the conductive films arranged on both sides of the MR elements, but these conductive films may be omitted. In this case, two MR elements may be magnetically biased mutually in opposite directions by passing the electric current through two MR elements in the same direction. In this case, since it is not necessary to use the direct current power source for the magnetic bias, the detection apparatus according to the invention can be further simple in construction and inexpensive in cost. Moreover, in the embodiment shown in FIG. 3, two MR elements of each magnetic sensor may be arranged near a permanent magnet, so that two MR elements may be magnetically biased in opposite directions to each other. Moreover, in the embodiment shown in FIG. 7, the films forming the first and second magnetic sensors 41 and 42 are arranged vertically with respect to the magnetic recording medium 40, but it is possible to arrange these films horizontally with respect to the magnetic recording medium 40. Furthermore, in case that the external magnetic field has a known direction, it is not always necessary to bias magnetically the MR elements. Then the first and second magnetic sensors may be constructed by a simple three layer construction such that the MR element and the conductive film are arranged on both sides of the insulating film, and then it is possible to detect only the signal magnetic field in the second magnetic sensor by feeding back negatively an output detected by the first magnetic sensor to both magnetic sensors as shown in FIG. 7.

According to the magnetic detection apparatus mentioned above, since the second magnetic sensor can derive only the second magnetic field to be detected under the existence of the first magnetic field by feeding back negatively the output of the first magnetic sensor for detecting the first magnetic field to the second magnetic sensor so as to cancel the first magnetic field component, it is possible to detect only the second magnetic field in an accurate manner without being affected by the first magnetic field. Moreover, in case of applying the present invention to the displacement detection apparatus shown in FIG. 7, since a plurality of MR elements can be arranged on almost the same line perpendicular to the displacement direction of the magnetization recording medium, it is possible to detect the magnetic patterns recorded on the magnetic recording medium without being affected by the pitch of the magnetization patterns. Therefore, in case of changing the magnetic recording medium to be detected, it is not necessary to change the magnetic sensor correspondingly. Further, in case of applying the present invention to a rotary encoder in which the magnetic recording medium is arranged on a circular plate or on a wall of a cylinder, since the distance between all the MR elements and the magnetic recording medium is always equal to each other during the rotation, it is possible to obtain the uniform output so as to perform accurate detection and thus it is not necessary to change the width of each MR element. Furthermore, since it is possible to apply the present invention to any existing magnetic recording medium, the present invention can be implemented in an easy and inexpensive manner.

What is claimed is:

1. A magnetic detection aparatus for detecting an intensity of a signal magnetic field in the presence of an external magnetic field, comprising:
    a first magnetic sensor including a magnetoresistive element exposed only to the external magnetic field and an output means for detecting an intensity of the external magnetic field and generating an output signal representing said intensity of the external magnetic field;
    a second magnetic sensor including a magnetoresistive element arranged in a space in which both the signal magnetic field and the external magnetic field are present and an output means for detecting an intensity of the signal magnetic field and for generating an output signal representing said intensity of the signal magnetic field; and
    compensator means arranged near the second magnetic sensor and connected to said output means of the first magnetic sensor to produce in response to said output signal of the first magnetic sensor a compensating magnetic field having an amplitude equal to that of the external magnetic field and a direction opposite to that of the external magnetic field.

2. An apparatus according to claim 1, wherein said compensator means comprises a conductive layer provided in the second magnetic sensor and an electric conductor for connecting an output of the first magnetic sensor to said conductive layer.

3. An apparatus according to claim 2, wherein said conductive layer is applied on one side of an insulating layer, the magnetoresistive element of the second magnetic sensor being applied on the other side of said insulating layer.

4. An apparatus according to claim 2, further comprising a second conductive layer connected in series with said electrical conductor, whereby said second conductive layer is applied on one side of a second insulating layer on the other side of which is applied the magnetoresistive element of said first magnetic sensor.

5. An apparatus according to claim 1, wherein said first magnetic sensor comprises at least two magnetoresistive elements and first means for biasing said two magnetoresistive elements in opposite directions to each other and said second magnetic sensor comprises at least two magnetoresistive elements and second means for biasing said two magnetoresistive elements in opposite directions to each other.

6. An apparatus according to claim 5, wherein each of said first and second biasing means comprises a biasing conductive layer arranged between its associated two magnetoresistive elements and means for conducting an electric current through the associated biasing conductive layer in a given direction.

7. An apparatus according to claim 5, wherein each of said first and second biasing means comprises a permanent magnet arranged between the associated two magnetoresistive elements.

8. An apparatus according to claim 5, wherein each of said first and second biasing means comprises means for conducting an electric current through the associated two magnetoresistive elements in opposite directions to each other.

9. An apparatus according to claim 5, wherein said at least two magnetoresistive elements of the first magnetic sensor are connected to form a first bridge circuit and said at least two magnetoresistive elements of the second magnetic sensor are connected to form a second bridge circuit.

10. An apparatus according to claim 9, wherein said two magnetoresistive elements of each of said first and second magnetic sensors are respectively connected in series with each other between positive and negative voltage supply sources.

11. An apparatus according to claim 10, wherein said biasing means comprises a conductive layer interposed between the first and second magnetoresistive elements of each of the first and second magnetic sensors via insulating layers, and means for conducting an electric current through said conductive layer in a given direction.

12. An apparatus according to claim 11, wherein said compensator means comprises a second conductive layer provided in the second magnetic sensor such that the first and second magnetoresistive elements are positioned on one side of the second conductive layer, and an electrical conductor for connecting the second conductive layer to an output of the first bridge circuit.

13. An apparatus according to claim 9, wherein said two magnetoresistive elements of each of said first and second magnetic sensors are connected in series with each other and each of said first and second magnetic sensors further comprises third and fourth magnetoresistive elements connected in series with each other, the first and second magnetoresistive elements being connected to a positive voltage supply source and the second and the fourth magnetoresistive elements being connected to a negative voltage supply source, and a differential amplifier having inputs connected to junction points between the first and second magnetoresistive elements and the third and fourth magnetoresistive elements, respectively.

14. An apparatus according to claim 13, wherein said biasing means of each of said first and second magnetic sensors comprises a biasing conductive layer arranged between the first and second magnetoresistive elements and the third and fourth magnetoresistive elements via insulating layers, and means for conducting an electric current through said conductive layer in a given direction.

15. An apparatus according to claim 14, wherein said compensator means comprises a second conductive layer provided in the second magnetic sensor such that all of the first, second, third and fourth magnetoresistive elements are positioned on one side of said second conductive layer, and an electrical conductor for connecting said second conductive layer to an output of said differential amplifier of the first magnetic sensor.

16. An apparatus according to claim 15, further comprising a second conductive layer provided in the first magnetic sensor such that all the first, second, third and fourth magnetoresistive elements are positioned on one side of said second conductive layer of the first magnetic sensor, and said second conductive layer of the first magnetic sensor is connected in said electrical conductor in series therewith to produce in the first magnetic sensor a magnetic field having a magnitude equal to the first magnetic field and a direction opposite to the first magnetic field.

* * * * *